(12) United States Patent
Liu et al.

(10) Patent No.: US 11,831,303 B2
(45) Date of Patent: Nov. 28, 2023

(54) HIGH ACCURACY CURRENT SENSING FOR GaN POWER SWITCHING DEVICES

(71) Applicant: GaN Systems Inc., Ottawa (CA)

(72) Inventors: Xuechao Liu, Kanata (CA); Ruoyu Hou, Kanata (CA)

(73) Assignee: GAN SYSTEMS INC., Ottawa (CA)

( * ) Notice: Subject to any disclaimer, the term of this patent is extended or adjusted under 35 U.S.C. 154(b) by 196 days.

(21) Appl. No.: 17/533,365

(22) Filed: Nov. 23, 2021

(65) Prior Publication Data

US 2022/0182048 A1    Jun. 9, 2022

Related U.S. Application Data

(60) Provisional application No. 63/122,566, filed on Dec. 8, 2020.

(51) Int. Cl.
*H03K 17/082* (2006.01)
*H02M 1/00* (2006.01)
(Continued)

(52) U.S. Cl.
CPC ..... *H03K 17/0822* (2013.01); *H01L 29/2003* (2013.01); *H02M 1/0009* (2021.05);
(Continued)

(58) Field of Classification Search
CPC ....... H03K 17/0822; H03K 2017/0806; H03K 2217/0027; H02M 1/0009; H02M 1/32; H02M 3/33569; H01L 29/2003
See application file for complete search history.

(56) References Cited

U.S. PATENT DOCUMENTS

| | | | |
|---|---|---|---|
| 7,939,857 B1 * | 5/2011 | Wyatt | H03F 1/223 330/311 |
| 8,803,508 B2 * | 8/2014 | Nakatake | H02H 3/08 324/123 R |

(Continued)

OTHER PUBLICATIONS

Roberts, John et al., "Drive and Protection Methods for Very High Current Lateral GaN Power Transistors"; 2015 IEEE Applied Power Electronics Conference and Exposition (APEC); Charlotte N.C. 2015, pp. 3128-3131, doi:10.1109/APEC.2015.7104798.

(Continued)

*Primary Examiner* — Rafael O Leon De Domenech
(74) *Attorney, Agent, or Firm* — WORKMAN NYDEGGER

(57) ABSTRACT

High accuracy current sense circuitry for power switching devices comprising GaN power transistors provides for current feedback functions, e.g. current loop control, over-current protection (OCP) and short-circuit protection (SCP). The current sense circuitry comprises a current mirror sense GaN transistor (Sense_GaN) and a power GaN transistor (Power_GaN) and a sampling circuit. The sampling circuit comprises first and second stage operational amplifiers to provide fast response and improved current sense accuracy, e.g. better than 1%, over a range of junction temperatures Tj. The Sense_GaN, Power_GaN and first stage operational amplifier have a common ground referenced to a Kelvin Source of the Power_GaN, so that the Sense_GaN and Power_GaN operate with the same gate-to-source voltage Vgs, to provide an accurate current ratio. Applications include current sensing for switching mode power supplies that need high speed and lossless current sense for current protection and feedback.

16 Claims, 10 Drawing Sheets

(51) Int. Cl.
  *H02M 1/32* (2007.01)
  *H01L 29/20* (2006.01)
  *H02M 3/335* (2006.01)
  *H03K 17/08* (2006.01)

(52) U.S. Cl.
  CPC ......... *H02M 1/32* (2013.01); *H02M 3/33569* (2013.01); *H03K 2017/0806* (2013.01); *H03K 2217/0027* (2013.01)

(56) References Cited

U.S. PATENT DOCUMENTS

| | | | |
|---|---|---|---|
| 10,666,147 | B1 | 5/2020 | Ribarich et al. |
| 10,819,102 | B2 | 10/2020 | Mayell |
| 2006/0114633 | A1* | 6/2006 | Watanabe .......... H03K 17/0822 361/93.1 |
| 2015/0061643 | A1* | 3/2015 | Aerts ..................... G01R 15/08 324/123 R |
| 2018/0062643 | A1* | 3/2018 | Trescases ................ H03K 5/08 |
| 2019/0140630 | A1 | 5/2019 | Chen et al. |
| 2020/0220468 | A1 | 7/2020 | Rainer et al. |
| 2020/0328682 | A1 | 10/2020 | Ribarich et al. |
| 2022/0060116 | A1* | 2/2022 | Wu ....................... H01L 29/7816 |
| 2022/0068918 | A1* | 3/2022 | Fukuhara ............. H01L 27/088 |

OTHER PUBLICATIONS

Roberts, John; "Lateral GaN Transistors—A Replacement for IGBT devices in Automotive Applications" PCIM Europe 2014; May 20-22, 2014; Nuremburg, Germany; pp. 310-317; ISBN 978-3-8007-3603-4.

Wang, Gangyao; "How to protect SiC MOSFETs . . . the best way!" training.ti.com; pp. 1-21; (2018hvi_how_to_protect_sic_mosfets_the_best_way).

ON Semiconductor; "Current Sensing Power MOSFETs"; AND8093/D; pp. 1-12 https://www.onsemi.com/pub/Collateral/AND8093-D.PDF.

Texas Instruments; "Understanding the Short Circuit Protection for Silicon Carbide MOSFETs"; SLUA863B Jan. 2018—Revised May 2020; 3 pages.

Baliga, B. J. et al.; "The BaSIC Topology: A New Technique to Improve Short Circuit Capability of SiC and GaN Power Devices"; pp. 1-51; Sep. 3, 2020.

\* cited by examiner

Example: 65W QR Flyback converter
RMS current is 1A at 90Vac input:
- Shunt resistor loss=0.25W
- Efficiency drop=0.4%
- Same loss as GaN transistor conduction loss
Discrete GaN Transistor :
GS-065-011-1-L
**(5*6mm PQFN)**
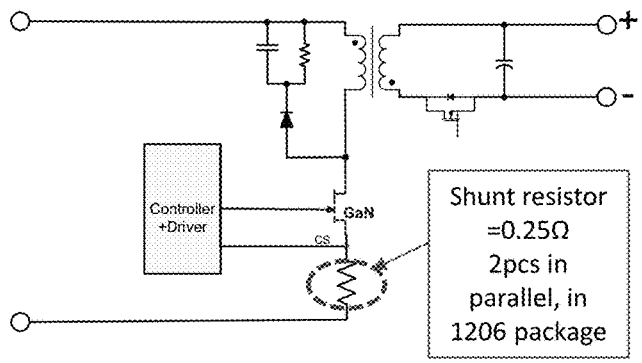
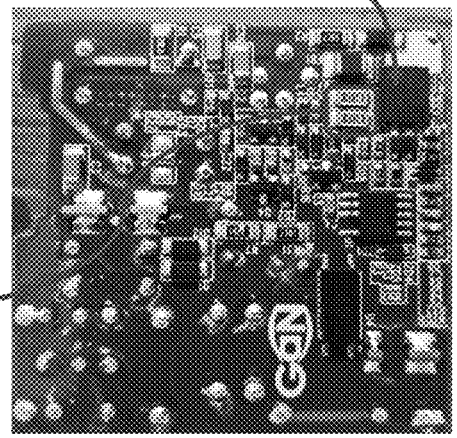
Conventional current sensing with shunt resistor
65W QR Ref Design Example
Fig. 1  Fig. 2
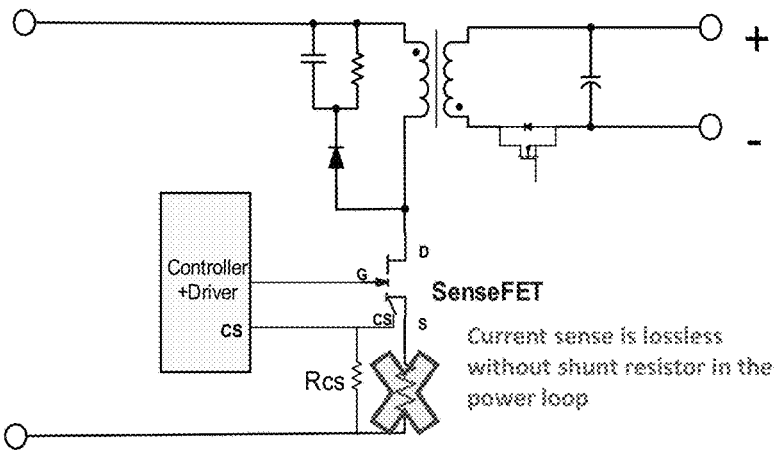
Current sensing with SenseFET (Current mirror and current sense resistor Rcs)
Fig. 3

Analysis of current accuracy for current sensing with conventional SenseFET

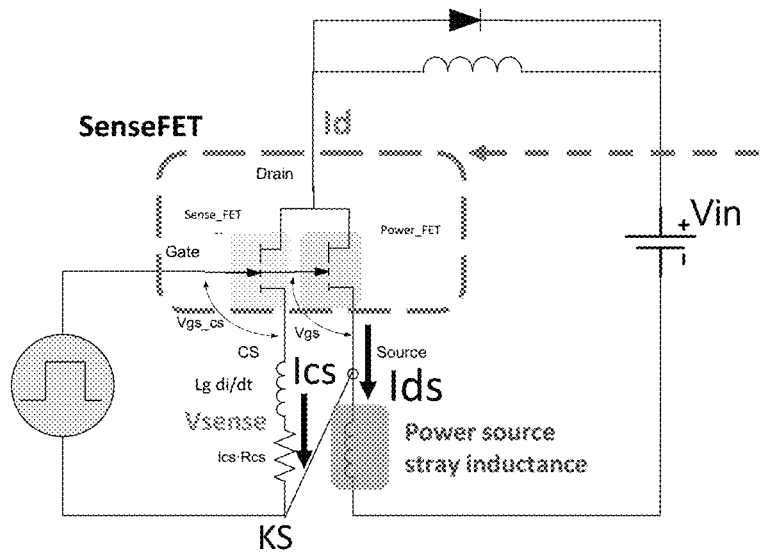 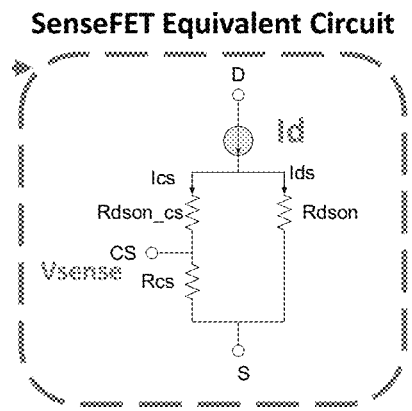

Fig. 4A  Fig. 4B

$$V_{sense} = Id \frac{R_{dson} \cdot R_{CS}}{R_{dson} + R_{dson\_cs} + R_{CS}} \quad (1)$$

$$V_{gs\_cs} = V_{gs} - I_{cs} \cdot R_{cs} - L_g \cdot dI_{cs}/dt \quad (2)$$

$$V_{gs\_cs} \neq V_{gs} \quad \text{unless resistive and inductive voltage drops are negligible} \quad (3)$$

where
- $R_{dson}$: Power_FET on-state resistor
- $R_{dson\_cs}$: Sense_FET on-state resistor
- $R_{cs}$: Current sense resistor
- $V_{sense}$: Current sense voltage
- $Id$: Drain to Source current
- $I_{cs}$: Sense_FET current
- $V_{gs\_cs}$: Sense_FET gate to source voltage
- $V_{gs}$: Power_FET gate to source voltage
- $L_g$: Sense_FET common source (gate loop) parasitic inductance

Fig. 4C

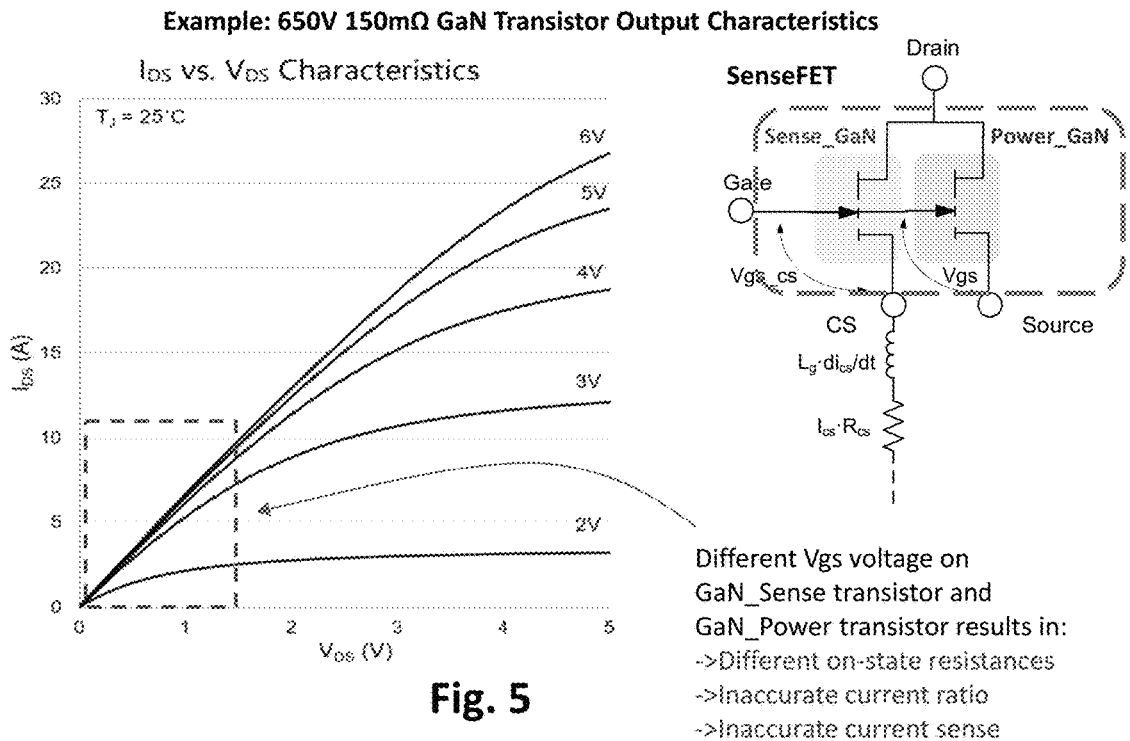
Fig. 5
$$V_{gs} \neq V_{gs\_cs} = V_{gs} - I_{cs} \cdot R_{cs} - L_g \cdot dI_{cs}/dt \qquad (4)$$
Different transconductance of Power_GaN and Sense_GaN transistors
$$g_m \neq g_{m\_Sense\_GaN}$$
Inaccurate current ratio $I_{ds}/I_{cs}$
Inaccurate current sense
Fig. 6

Case 1: QR Flyback using conventional SenseFET and sense resistor Rcs

- Junction temperatures Tj=25° and Tj=125°C
- OCP current: 3.2A
- Power : 65W
- Vsense: 0.8V

Parameters:
- Junction temperatures: Tj=25° and Tj=125°C
- Sense_GaN Rdson_cs=300Ω
- Power_GaN Rdson=0.3Ω
- Rdson ratio (Rdson_cs/Rdson)=1000
- Rcs=3Ω
- R2:R1 ratio=80
- OCP current=3.2A Tj=25°C waveforms Tj=125°C waveforms

Case 2: High Accuracy SenseGaN
(SenseGaN + Sampling circuit)

- Junction temperature Tj=25° and 125°C
- OCP current: 3.2A
- Power : 65W
- Vsense: 0.8V

- Current sense accuracy (<1%) is achieved with the High Accuracy SenseGaN circuit
- Independent of junction temperature Tj over range of 25°C to 125°C 25°C waveforms 100°C waveforms

HIGH ACCURACY CURRENT SENSING FOR GAN POWER SWITCHING DEVICES

CROSS-REFERENCE TO RELATED APPLICATION(S)

This application claims the benefit of U.S. provisional patent application No. 63/122,566, filed Dec. 8, 2020, entitled "HIGH ACCURACY CURRENT SENSING FOR GaN POWER SWITCHING DEVICES", which is incorporated herein by reference in its entirety.

TECHNICAL FIELD

This invention relates to current sensing for power switching devices, e.g. for current control, overcurrent protection and short circuit protection for power switching devices and systems comprising GaN power transistors.

BACKGROUND

Fast, wide-bandgap semiconductor power devices, such as Silicon Carbide (SiC) or Gallium Nitride (GaN) power transistors require fast short circuit protection (SCP) and overcurrent protection (OCP). Industry standard OCP options for IGBTs (Insulated Gate Bipolar Transistors) are typically too slow for protecting faster GaN power switching devices. For example, the thermal mass of a lateral GaN HEMT is small; e.g., during a short circuit or overcurrent, a lateral GaN HEMT may heat up very quickly and have a survival time of only 300 ns to 500 ns. An IGBT is typically more robust and can survive a few microseconds.

For example, the following methods for overcurrent/short circuit protection are known:
- De-saturation (DESAT) detection: widely used for IGBTs; may not meet the speed requirements for GaN devices and only be suitable for SCP.
- Current sense resistor: a low-cost solution, a current sense shunt resistor causes significant power loss in high current applications and adds parasitic inductance, which adversely affects switching performance.
- Di/dt detection by voltage sensing across a common source inductance: this approach is suitable for an IGBT module but not appropriate for GaN power switches in which it is desirable to minimize source inductance.
- Hall Effect sensor: based on magnetics.
- A current mirroring sense FET: a sensing cell of a power semiconductor device provides a current output to a current detection circuit.

For background information, document no. SLUA863 by Texas Instruments entitled "Understanding the Short circuit protection for Silicon Carbide MOSFETs", published January 2018-Revised May 2020, provides a summary of desaturation detection, shunt resistor current sensing, and SenseFET current sensing schemes for SiC MOSFETs vs. IGBTs.

An article by John Roberts et al., (GaN Systems Inc.) entitled "Drive and protection methods for very high current lateral GaN power transistors" 2015 IEEE Applied Power Electronics Conference and Exposition (APEC) Charlotte N.C. 2015, pp. 3128-3131, provides background information relating to high speed current monitoring and short circuit protection for high current lateral GaN power transistors using a SenseGaN device comprising a small sense transistor in parallel with a GaN power transistor for drain voltage and drain current sensing. This reference identifies some limitations of conventional monitoring and protection solutions that are used for IGBTs and Si MOSFETs.

For example, there are challenges in providing fast accurate current sensing measurements for power switching devices comprising GaN power transistors over a wide range of operating temperatures and power ranges. For example, there is a need for solutions which provide high speed and lossless current sensing for feedback and protection for applications such as switching mode power supplies (SMPS).

There is a need for improved or alternative solutions for current control, overcurrent protection and short circuit protection for power switching devices and systems comprising GaN power transistors.

SUMMARY OF INVENTION

The present invention seeks to provide current sensing solutions, e.g. for current monitoring and control, overcurrent protection and short circuit protection for power switching devices and systems comprising GaN power transistors, which address at least one of the above mentioned problems, or at least provide an alternative.

A first aspect of the invention provides a current sensing circuit for a power switching device comprising: a GaN power transistor and a GaN sense transistor, each having a drain, a source and a gate; and a sampling circuit;

the sampling circuit having first and second inputs and an output;

the GaN sense transistor being configured as a current mirror with the drain of the GaN power transistor being connected to the drain of the GaN sense transistor, the gate of the GaN power transistor being connected to the gate of the GaN sense transistor, the source of the GaN sense transistor being connected to the first input of the sampling circuit to provide a current sense input $I_{cs}$ to the sampling circuit, and the source of the GaN sense transistor and the second input of the sampling circuit being connected to a Kelvin source of the GaN power transistor, whereby the gate-to-source voltage of the GaN sense transistor and the gate-to-source voltage of the GaN power transistor are substantially the same;

the sampling circuit being configured to convert the current sense input $I_{cs}$ to a first sense voltage $V_{sense}$ and to amplify the first sense voltage $V_{sense}$ to provide a second sense voltage $V_{cs}$ at the output of the sampling circuit.

When a small current sense GaN power transistor (Sense_GaN) to sense current is connected in parallel with a high current GaN power transistor (Power_GaN), the current sense ratio (Ids/Ics) ideally follows the on-state resistances $R_{dson}$ and $R_{dson\_cs}$ of the Power_GaN and Sense_GaN. The sampling circuit allows for current sensing by the sense transistor while ensuring that the relative transconductance of the GaN sense transistor and the GaN power transistor are substantially the same (e.g. effectively matched or equal), with the same transient characteristics. In contrast, in conventional SenseFET solutions, when implemented using GaN power transistors, voltage drops across the sense resistor and stray inductance in the gate loop de-bias the gate of the sense transistor, so that the gate-to-source voltage of the sense transistor $V_{gs\_cs}$ is not equal to the gate-to-source voltage $V_{gs}$ of the power transistor. If $V_{gs} \neq V_{gs\_cs}$, the transient characteristics are not the same, leading to poor current accuracy, and also, the on-state resistance of the sense GaN transistor and the power GaN transistor has significant dependence on junction temperature Tj, which leads to poor current accuracy.

For example, the sampling circuit comprises a first stage and a second stage, the first stage being a current to voltage converter which receives the current $I_{cs}$ from the GaN sense transistor and outputs the first sense voltage $V_{sense}$; and the second stage being a voltage amplifier which receives the sense voltage $V_{sense}$ and outputs the second sense voltage $V_{cs}=n*V_{sense}$.

The sampling circuit may be implemented with Operational Amplifiers (OpAmps) to improve the current sense accuracy with variable junction temperature (Tj). The sampling circuit can be integrated within a monolithic Sense-GaN or provided as an external Opamps circuit for discrete solutions.

In example embodiments, the current sensing circuit overcomes problems with conventional current sensing circuits comprising a SenseFET, in which parameter deviations at different junction temperatures (Tj) and differences in $V_{gs}$ and $V_{gs\_cs}$ lead to poor accuracy, and significant dependence on junction temperature. A high accuracy current sense with GaN transistors can be achieved for the current feedback functions such as current loop control, over current protection (OCP) and short circuit protection (SCP).

For example, in an embodiment, the sampling circuit comprises first and second stage operational amplifiers,
  the first stage operational amplifier being configured as a current to voltage converter with a feedback resistor $R_{CS}$, wherein its inverting input receives the current $I_{cs}$ from the GaN sense transistor and its non-inverting input is connected to the Kelvin source, to provide the first sense voltage $V_{sense}$ at a first stage output;
  the second stage operational amplifier being configured as a voltage amplifier with an amplification ratio n, which receives the sense voltage $V_{sense}$ at its inverting input, and its non-inverting input is connected to the Kelvin source, to provide the second sense voltage $V_{cs}=n*V_{sense}$ at a second stage output.

The first stage amplifier senses current to provide a small voltage signal and the second stage amplifier amplifies the small voltage signal to a voltage signal meeting requirements of a device controller. This approach provides improved current sensing with temperature independence. For example, the current sensing circuit of example embodiments may be configured for at least one of current monitoring and feedback, and implementation of current protection functions such as overcurrent protection and short circuit protection.

For example, for a required maximum drain current $I_d$max for triggering current protection functions, the current sense resistor of the first stage, $R_{cs}$, is selected to provide the first sense voltage $V_{sense}$ in a range from tens of mV to around 100 mV, and $V_{sense}$ is amplified to provide the second sense voltage $V_{cs}$ of ~1V, e.g. 0.8V.

In an example embodiment, for a required maximum drain current $I_{d\_max}$ for triggering current protection functions, $R_{cs}$ is selected to provide the first sense voltage $V_{sense}$ in a range from tens of mV to around 100 mV, and
  the second stage operational amplifier comprises first and second resistors R1 and R2 to provide an amplification ratio of R2/R1, and wherein R1 and R2 are trimmed to match $V_{cs}$ to a specified trigger voltage for a controller/driver for overcurrent protection or short circuit protection.

Since the second stage provides amplification of $V_{sense}$ from the first stage, a relatively small current sense resistor $R_{cs}$ may be used as the feedback resistor of the first stage operational amplifier. The amplification ratio of the second stage operational amplifier is selected to provide a suitable output voltage Vcs for current monitoring and protection functions. The second stage operational amplifier provides voltage amplification to reduce or minimize inaccuracy with temperature variations.

For example, for a required maximum drain current $I_{d\_max}$ for triggering current protection functions, and a specified on-resistance ratio $R_{dson\_cs}/R_{dson}$ for the GaN power transistor and the GaN sense transistor, the value of $R_{cs}$ is selected to provide the first sense voltage $V_{sense}$ in a range up to 100 mV, and $V_{sense}$ is amplified to provide the second sense voltage $V_{cs}$, that is a specified trigger voltage for a controller/driver for overcurrent protection or short circuit protection. The value of Rcs is selected to be small enough to provide a current accuracy of better than 1%, while optimizing $V_{sense}$ to be in a range of tens of millivolts to ~100 mV and with a suitable amplification ratio to provide a high enough $V_{cs}$ for a specified trigger voltage.

The current sensing circuit may be implemented with discrete or monolithically integrated components. For example, in some embodiments, the sense GaN transistor and the power GaN transistor may be monolithically integrated, and optionally the sampling circuit is monolithically integrated with the sense GaN transistor and the power GaN transistor.

In other embodiments, the sense GaN transistor is discrete from the power GaN transistor. For example, the sense GaN transistor may be discrete from the power GaN transistor and the sense GaN transistor is monolithically integrated with the sampling circuit.

In operation, the output of the sampling circuit is connected to the current sense input of a controller/gate driver for driving the gates of the sense GaN transistor and the power GaN transistor, to feed the second sense voltage $V_{cs}$ to the controller for implementing any one of current monitoring and feedback, overcurrent protection and short circuit protection.

The current sensing circuit is applicable to switch mode power supplies (SMPS), such as QR Flyback converters and Active clamp Flyback converters, and other SMPS topologies requiring high speed and lossless current sense for current feedback and protection functions.

Current sensing circuits of example embodiments are described with reference to power switching devices comprising GaN transistors for the power transistor and sense resistor. It envisaged that high accuracy current sensing circuits of other embodiments may be implemented using power transistors based on other semiconductor technologies, e.g. Si MOSFETs and SiC MOSFETs.

Accordingly, another aspect of the invention provides current sensing circuit for a power switching device comprising: a power transistor and a sense transistor, each having a drain, source and gate, and a sampling circuit;
  the sampling circuit having first and second inputs and an output;
  the sense transistor being configured as a current mirror with the drain of the power transistor being connected to the drain of the sense transistor, the gate of the power transistor being connected to the gate of the sense transistor, the source of the sense transistor being connected to the first input of the sampling circuit to provide a current sense input $I_{cs}$ to the sampling circuit, and the source of the sense transistor and the second input of the sampling circuit being connected to a Kelvin source of the power transistor, whereby the gate-to-source voltage of the GaN sense transistor and the gate-to-source voltage of the GaN power transistor are substantially the same;

the sampling circuit being configured to convert the current sense input $I_{Cs}$ to a first sense voltage $V_{sense}$ and to amplify the first sense voltage $V_{sense}$ to provide a second sense voltage $V_{cs}$ at the output of the sampling circuit.

Semiconductor power switching devices are provided that provide high accuracy current sensing for power switching devices, e.g. comprising high current lateral GaN power transistors, for current feedback functions such as current loop control, over-current protection (OCP) and short circuit protection (SCP). In example embodiments, the current sense circuitry comprises a sense GaN transistor (Sense_GaN) in parallel with the high current GaN power transistor (Power_GaN) and a sampling circuit. The sampling circuit comprises operational amplifiers to provide fast response and improved current sense accuracy, over a range of junction temperatures Tj. Applications include current sensing for switching mode power supplies that need high speed and lossless current sense for current protection and feedback.

The foregoing and other features of aspects of the present invention will become more apparent from the following detailed description, taken in conjunction with the accompanying drawings, of some embodiments of the invention, which description is by way of example only.

BRIEF DESCRIPTION OF THE DRAWINGS

FIG. 1 shows a circuit schematic for a quasi-resonant (QR) flyback power converter comprising a discrete GaN power transistor and a shunt resistor for current sensing;

FIG. 2 shows a photograph of a reference design example comprising a 65 W QR flyback power converter comprising a discrete GaN power transistor and shunt resistors;

FIG. 3 shows a circuit schematic for a QR flyback power converter comprising a power transistor having an integrated sense transistor which acts as a current mirror (SenseFET) and a current sense resistor $R_{cs}$;

FIG. 4A shows a circuit schematic comprising a SenseFET comprising a power transistor and a sense transistor, and a sense resistor $R_{cs}$ and FIG. 4B shows a SenseFET equivalent circuit;

FIG. 4C shows the dependence of the current sense voltage $V_{sense}$ on the drain to source current Id and resistances of the equivalent circuit in equation (1); the relationship between the gate-to-source voltage $V_{gs}$ of the power transistor and the gate-to-source voltage $V_{gs\_cs}$ of the sense transistor in equations (2) and (3);

FIG. 5 shows an example of output characteristics for a 650V 150Ω m GaN transistor;

FIG. 6 is a schematic that illustrates that for current sensing with a SenseFET comprising GaN transistors, different gate-to-source voltages for the sense transistor and the power transistor results in different transconductance for the power transistor and the sense transistor, which leads to an inaccurate current ratio and inaccurate power sense;

DETAILED DESCRIPTION

Figure 7A:
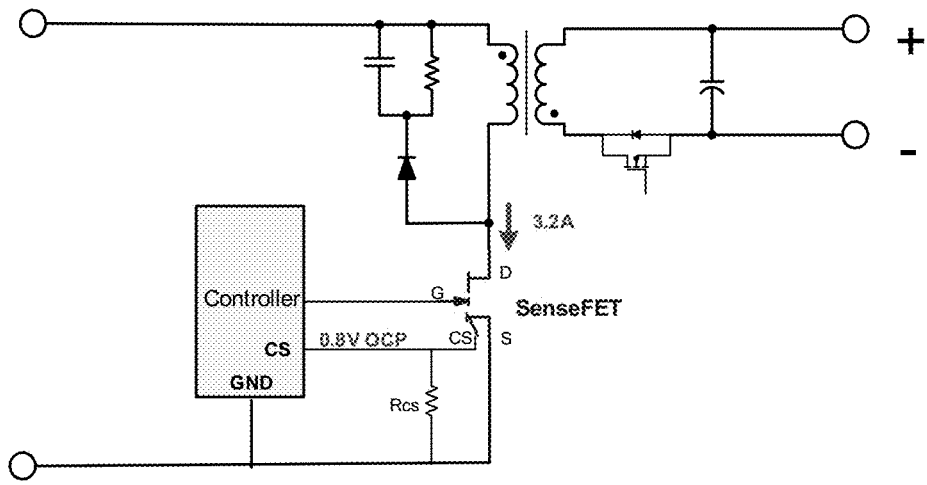
FIG. 7A shows an example 65 W QR Flyback converter using a conventional current sensing circuit comprising a SenseFET and sense resistor $R_{cs}$.

FIG. 1 shows a circuit schematic for a quasi-resonant (QR) flyback power converter comprising a discrete GaN power transistor switch and a shunt resistor for current sensing. A shunt resistor provides fast, accurate current sensing, at low cost. However, the shunt resistor results in significant power losses in high power applications and introduces parasitic inductance of the resistor and its interconnections in the gate loop. As an example, FIG. 2 shows a photograph of a printed circuit board for a reference design comprising a 65 W QR flyback power converter comprising a discrete GaN power transistor (GaN Systems GS-6511-1-L in a 5×6 mm PQFN package), and 0.25Ω a shunt resistor comprising two surface mount pieces (in 1206 packages) in parallel.

FIG. 3 shows a circuit schematic for a quasi-resonant (QR) flyback power converter comprising a power transistor switch comprising a power transistor having an integrated current mirror sense transistor (SenseFET transistor) and a current sense resistor Rcs connected between the source of the current mirror sense transistor and the source of the power transistor. Removing the shunt resistor from the power source connection of the power transistor provides for lossless current sensing, i.e. negligible losses.

Comparing the SenseFET solution shown in FIG. 3, and the conventional solution with a shunt resistor shown in FIGS. 1 and 2, for an RMS current of 1 A at 90 Vac input, the shunt resistor loss is 0.25 W, which is the same loss as the GaN transistor conduction loss (GS065011-1-L having $R_{dson}$ 150 mΩ), and the efficiency drop is 0.4% for a 65 W QR Flyback converter.

FIG. 4A shows a circuit schematic comprising a SenseFET transistor comprising a power transistor (Power_FET) and a sense transistor (Sense_FET), to illustrate stray inductances in the power source loop and in the sense transistor gate-source loop. As illustrated schematically in FIG. 4A, providing a gate drive circuit that is referenced to a Kelvin source (KS) of the GaN power transistor as the ground reference for $V_{sense}$ and the gate-to-source voltage ($V_{gs}$), avoids the power source stray inductance in the gate drive loop. FIG. 4B shows a SenseFET equivalent circuit comprising a power transistor on-state resistor $R_{dson}$, a sense transistor on-state resistor $R_{dson\_cs}$, a current sense resistor $R_{cs}$, which, for a drain-to-source current of $I_d$, generates a current sense voltage $V_{sense}$ at the current sense output CS. Equation (1) in FIG. 4C shows the relationship of the current sense voltage $V_{sense}$ on the drain to source current $I_d s$ and resistances of the equivalent circuit. The feedback current sense voltage $V_{sense}$ has a dependence on the on-state resistors $R_{dson}$ and $R_{dson\_cs}$. $R_{dson}$ and $R_{dson\_cs}$ are temperature dependent, which means that the current sense is not accurate for different junction temperatures Tj. As shown in equations (2) and (3) of FIG. 4C, there is a voltage drop on the sensing resistor $R_{cs}$ (static), represented by $I_{cs} \cdot R_{cs}$, and a voltage drop on the parasitic inductance (dynamic), represented by $L_g \cdot di_{cs}/dt$. $V_{gs}=V_{gs\_cs}$ only if these voltage drops are negligible. In practice, the gate-to-source voltage $V_{gs}$ for the power transistor is different from the gate-to-source voltage $V_{gs\_cs}$ for the sense transistor. That is, the gate-to-source voltage $V_{gs\_cs}$ of the sense transistor is de-biased relative to the gate-to-source voltage $V_{gs}$ of the power transistor, which results in different transconductance characteristics for the power transistor and the sense transistor. If $V_{gs} \neq V_{gs\_cs}$, the transient characteristics of the sense transistor and the power transistor are not the same, leading to poor current accuracy, and also, the on-state resistance of the sense GaN transistor and the power GaN transistor has significant dependence on junction temperature Tj, which leads to poor current accuracy.

As an example, FIG. 5 shows transistor output characteristics for an example GaN power transistor which is a 650V 150 mΩ GaN transistor, for different gate voltages. For a senseFET implemented with GaN transistors, a different gate-to-source voltage $V_{gs}$ for the GaN power transistor and $V_{gs\_cs}$ for the GaN sense transistor create different on-state resistances $R_{dson}$ and $R_{dson\_cs}$. Thus, since the current ratio is dependent on the ratio $R_{dson\_cs}/R_{dson}$, the current ratio is affected by non-negligible voltage drops in the gate-source loop of the GaN sense transistor, which leads to an inaccurate current ratio and inaccurate current sensing.

As illustrated schematically in FIG. 6, if $V_{gs} \neq V_{gs\_cs}$, this leads to a different transconductance characteristics for the power GaN transistor and the sense GaN transistor, which causes different current ratios (Ids and Ics), which causes poor current sense accuracy, and also, the on-state resistance of the sense GaN transistor and the power GaN transistor have significant dependence on junction temperature Tj, which leads to poor current accuracy. (The transconductance is the ratio of the change in drain current to the change in gate voltage on a drain current vs. gate voltage curve).

Figure 7B:
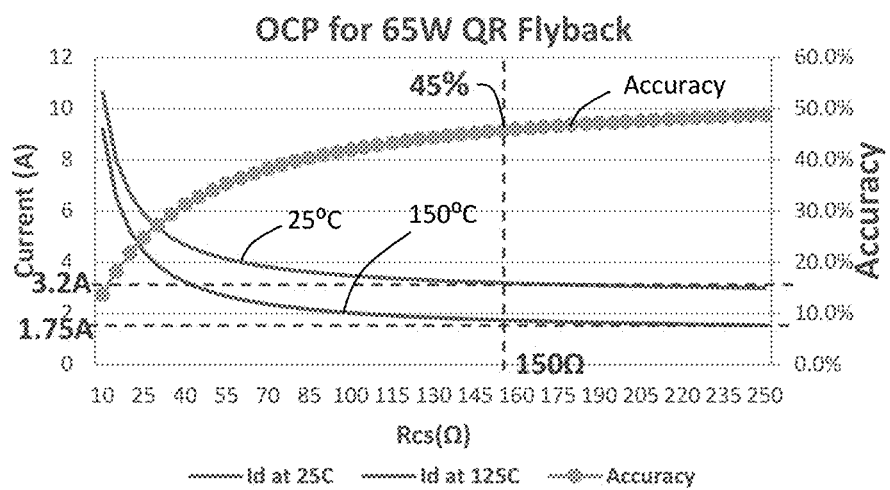
FIG. 7B shows plots of the drain current $I_d$ at junction temperatures Tj of 25° C. and 125° C., and a plot of the accuracy as a function of the value of the current sense resistor $R_{cs}$ of a conventional current sensing circuit comprising a SenseFET and sense resistor $R_{cs}$.

To illustrate these issues, FIG. 7A shows an example 65 W QR Flyback converter and FIG. 7B shows plots of the drain current $I_d$ required to trigger OCP at 25° C. and 125° C. and accuracy as a function of the value of the current sense resistor $R_{cs}$ of a conventional SenseGaN circuit. In this example case, it is required to select $R_{cs}$ to provide a $V_{sense}$ of 0.8V to trigger OCP for a OCP current of 3.2 A. Referring to the curve for Tj=25° C., a sense resistor of at least 150Ω is required to trigger OCP at 3.2 A. But, since this circuit is temperature dependent, for Tj=125° C., a sense resistor of 150Ω triggers OCP at only 1.75 A. It is apparent that the accuracy is strongly dependent on the value of the sense resistor $R_{cs}$, and $V_{sense}$ is significantly dependent on junction temperature.

Figure 8:
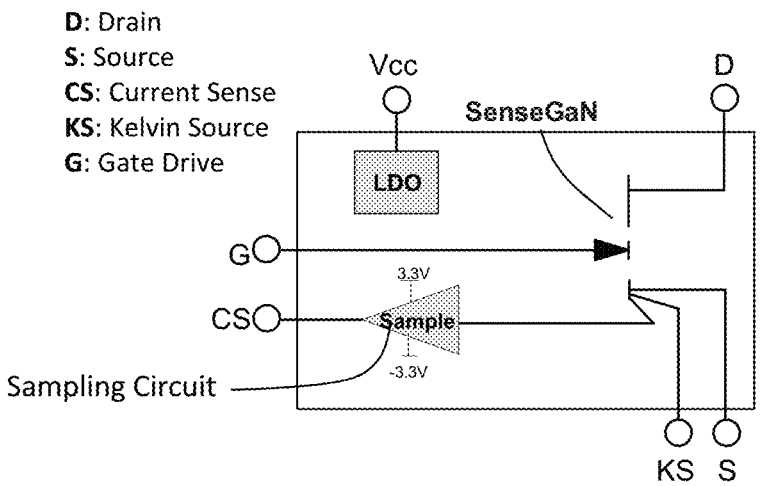
FIG. 8 shows a simplified circuit schematic of a high accuracy current sensing circuit comprising a GaN power transistor and a GaN sense transistor (SenseGaN) and a sampling circuit for implementing example embodiments for high accuracy current sensing (High Accuracy Sense-GaN)

FIG. 8 shows a simplified circuit schematic of a high accuracy current sensing circuit comprising a GaN power transistor, a current mirror GaN sense transistor (labelled as SenseGaN), and a sampling circuit for implementation of example embodiments, which are referred to as "High Accuracy SenseGaN" current sensing circuits. A small current sensing GaN sense transistor is connected in parallel with a high current GaN power transistor with a common drain connection and a common gate connection. The sampling circuit receives the GaN sense transistor current $I_{cs}$ according to the current sense ratio ($I_{ds}/I_{cs}$) and outputs a current sense voltage $V_{cs}$ at output CS. The GaN sense transistor, the GaN power transistor and the sampling circuit have a common ground connection referenced to the Kelvin Source (KS) of the GaN power transistor, as will be described in detail below, so that the current sense ratio ($I_{ds}/I_{cs}$) more accurately follows the ratio of on-state resistances $R_{dson}$ to $R_{dson\_cs}$ of the GaN power transistor and GaN sense transistor.

The High Accuracy SenseGaN current sensing circuit may be implemented with monolithically integrated components, or discrete components, or a combination of discrete and integrated components. For example, in some embodiments, the current sensing circuit comprises a single monolithic die which comprises a GaN power transistor and a GaN sense transistor connected in parallel as described herein. The GaN sense transistor includes one or a small number of Sense_GaN transistor cells in parallel with a plurality of Power_GaN transistor cells. The Sense_GaN cells are implemented to sense current using a current mirror effect, the Power_GaN cells handle the main power, and the current of the power stage is sensed by Sense_GaN cell(s) according to the current sense ratio ($I_{ds}/I_{cs}$), which is proportionate to the gate width $W_g$ of the Power_GaN transistor and the gate width $w_g$ of the Sense_GaN transistor.

In other embodiments, discrete GaN power transistors with different $R_{son}$ may be used: a smaller gate width, higher $R_{dson}$ GaN power transistor acts as a Sense_GaN for current sensing and a larger gate width, lower $R_{dson}$ GaN power transistor acts as Power_GaN for the main power stage.

High accuracy current sensing circuits of some example embodiments are described, wherein the sampling circuit is implemented comprising operational amplifiers (OpAmps), to improve the current sense accuracy with variable junction temperature (Tj). The sampling circuit can be integrated with a monolithic SenseGaN, or implemented as an external circuit with OpAmps for discrete solutions. The gate-to-source voltage $V_{gs\_cs}$ of the sense GaN transistor and the gate-to-source voltage $V_{gs}$ of power GaN transistor are referenced to the same ground with a Kelvin source (KS) connection, meaning that the transconductance of the sense GaN transistor and the power GaN transistor are the same, which provides high current mirror accuracy.

Figure 9:
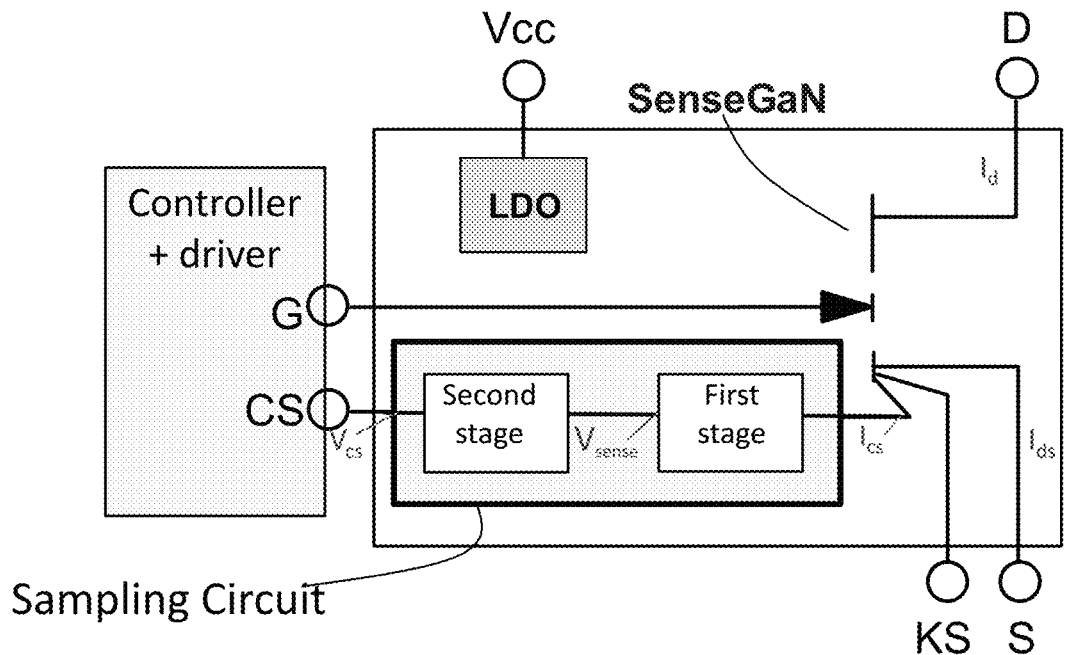
FIG. 9 shows a schematic functional block diagram of a high accuracy current sensing circuit comprising a GaN power transistor and a GaN sense transistor (SenseGaN), and a sampling circuit of first embodiment, wherein the sampling circuit comprises first and second stages.

As illustrated in the simplified schematic block diagram shown in FIG. 9, in a high accuracy SenseGaN circuit of a first embodiment comprises first and second stages. The first stage of the sampling circuit comprises a first operational amplifier, which is configured as a current-to-voltage converter to generate an output voltage $V_{sense}$ in response to the received current $I_{cs}$, and a second stage of the sampling circuit comprises a second operational amplifier, configured to amplify the voltage $V_{sense}$ and provide a current sense voltage output $V_{cs}$, which is fed to the current sense input CS of the controller/gate driver. The sampling circuit is configured to provide a current sense voltage output $V_{cs}$ having a suitable range of values, e.g. 0 to ~1V, for implementation of one or more of drain current monitoring and control, overcurrent protection (OCP) and short circuit protection (SCP) by the controller/driver. A supply voltage for the operational amplifiers may be provided by a LDO (low drop-out regulator). It is important that the GaN sense transistor and the GaN power transistor have a common gate-source ground, i.e. they are referenced to the Kelvin Source (KS) of the GaN power transistor, and that the first stage of the sampling circuit is configured so that the transconductances for the GaN sense transistor and the GaN power transistor are the same, with the same transient characteristics.

Operation of high accuracy current sensing circuit of an example embodiment is described in more detail with reference to the circuit schematic shown in FIG. 10.

Figure 10:
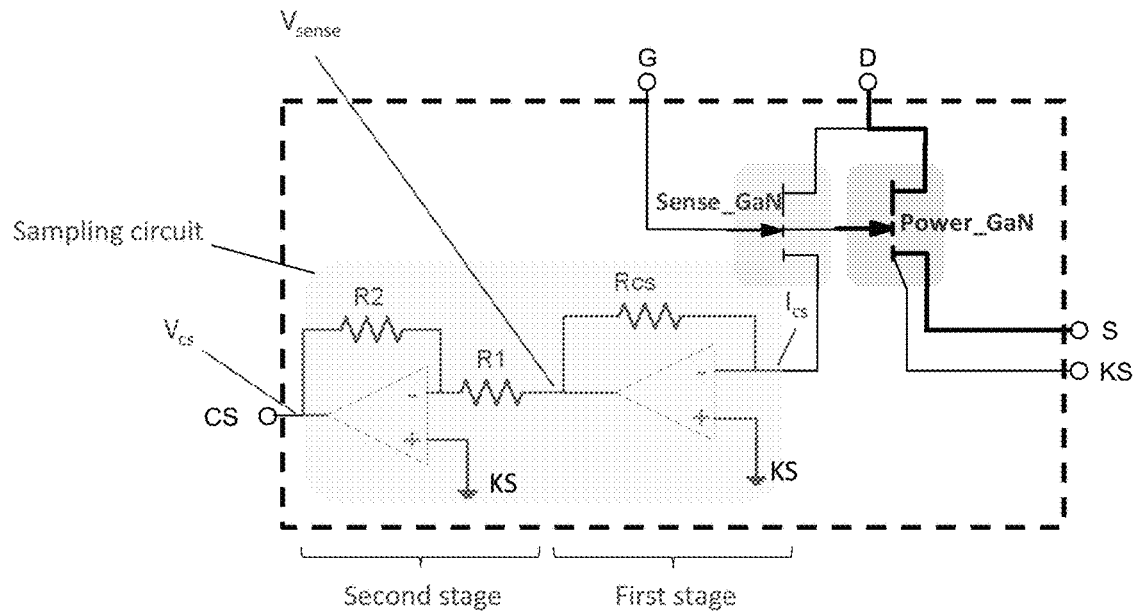
FIG. 10 shows a circuit schematic of a high accuracy current sensing circuit comprising a GaN power transistor, a GaN sense transistor, and a sampling circuit of a second embodiment wherein the sampling circuit comprises first and second stages comprising first and second operational amplifiers.

FIG. 10 shows a circuit schematic of a high accuracy current sensing circuit comprising a GaN power transistor, a GaN sense transistor, and a sampling circuit of a third embodiment High Accuracy SenseGaN current sensing circuit. The sampling circuit comprises a first stage comprising an operational amplifier, with a current sense resistor $R_{cs}$, configured as a current to voltage converter, which is referenced to the Kelvin source (KS) of the GaN power transistor, and a second stage operational amplifier for amplifying the output $V_{sense}$ received from the first stage, using first and second resistors R1 and R2 in ratio of R2:R1, to provide a voltage output $V_{CS}$ at output CS of the second stage. Both stages of sampling circuit are referenced to the Kelvin source KS of the power GaN transistor. The current sense resistor $R_{cs}$ of the first stage is chosen to have a small value to provide an output voltage of the first stage $V_{sense}$ in an appropriate range, e.g. a maximum value in the range of ~10 mV to ~100 mV. The first and second resistors R1 and R2 of the second stage OpAmp provide an appropriate amplification ratio R2/R1, e.g. ~10 to 100, to provide a $V_{cs}$ output in a suitable range, e.g. ~1V, to meet requirements of the controller/driver for a specified voltage of the current sense signal $V_{cs}$ to trigger protection functions.

As shown in FIG. 10, in the first stage, the source of the current sense transistor is referenced to the Kelvin source of the power transistor, and the sensed current $I_{cs}$ from the sense transistor is fed to the inverting terminal of the first OpAmp while the non-inverting terminal of the OpAmp is also reference to the Kelvin source (KS). The first stage, e.g. first OpAmp, is configured as current-to-voltage converter that generates a small negative current sense output voltage $V_{sense}$. For example, the current sense resistor may be selected to provide a first sense voltage $V_{sense}$ in a range from e.g. 0 to $V_{sense}$ max of ~10 mV. The first stage ensures that the Sense_GaN and Power_GaN have a common gate-source ground, Kelvin Source (KS), so that the transconductances for Sense_GaN and Power_GaN are the same with the same transient characteristics.

The second stage of the sampling circuit comprises the second OpAmp configured as a voltage amplifier, which receives $V_{sense}$ and generates an amplified output voltage, $V_{cs}$ at an appropriate level, e.g. in a range 0 to $V_{cs}$max~1V. It provides voltage amplification to minimize the inaccuracy with the variation of temperature. $V_{cs}$ is fed back to current sense input CS of the controller and gate driver for current monitoring, or to implement protection functions, e.g. OCP and/or SCP if $V_{cs}$ exceeds a threshold value. The required trigger voltage depends on the controller. Resistors (R1 and R2) may be trimmed to amplify $V_{sense}$ to provide a $V_{cs}$ which matches the value of trigger voltage to the controller for OCP or SCP.

Figure 11:
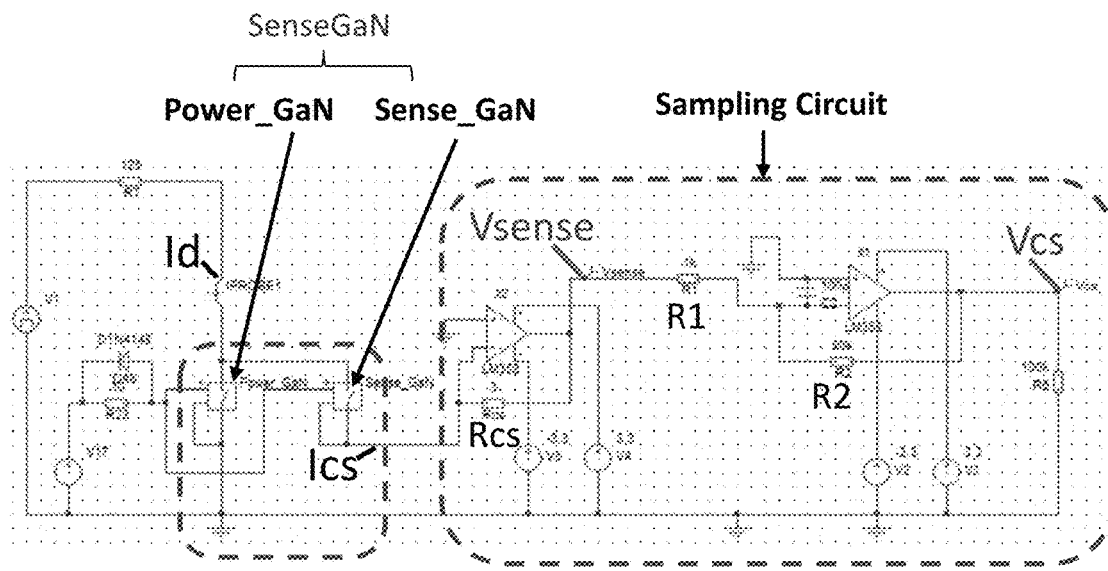
FIG. 11 shows an example circuit design schematic for a high accuracy current sensing circuit comprising a GaN power transistor, a GaN sense transistor, and a sampling circuit comprising first and second operational amplifiers of the second embodiment, wherein design parameters are selected to provide OCP at a drain-source current $I_d$ of 3.2 A.

FIG. 11 shows an example circuit design schematic for simulation of a high accuracy current sensing circuit comprising a GaN power transistor, a GaN sense transistor, and a two stage sampling circuit, with a table listing parameters for an example scenario, to demonstrate overcurrent protection at junction temperatures Tj of 25 C. and 125 C. These temperatures represent examples for room temperature operation and high temperature operation. In this example design, the power GaN transistor has an on-resistance $R_{dson}$ of 0.3Ω and the sense GaN transistor has on-resistance $R_{dson\_cs}$ of 300Ω, to provide an $R_{dson\_cs}/R_{dson}$ ratio of 1000. Thus, ideally $I_{cs}/I_{ds}=1/1000$. The circuit is configured to provide overcurrent protection at $I_d=3.2$ A, i.e. to trigger OCP when $I_{cs}$ reaches 32 mA. Using a current sense resistor $R_{cs}$ of 3Ω, this results in $V_{sense}$ of close to −10 mV when $I_t$ reaches 3.2 A. $V_{sense}$ is then amplified by the second stage amplifier. In this example R1=1 kΩ and R2=16 kΩ to provide an amplification factor of R2/R1=80, which provide a $V_{cs}$ output of 0.8V to the controller/driver to trigger OCP when $I_d$ reaches 3.2 A.

Figure 12A:
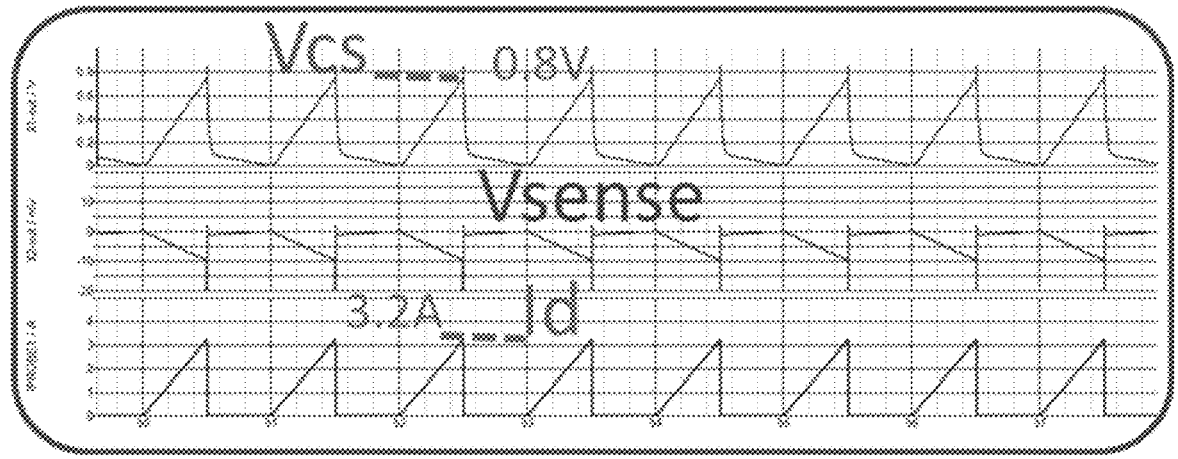
FIGS. 12A and 12B show waveforms for the drain source current $I_d$, and sense voltages $V_{sense}$ at the output of the first stage and current sense $V_{cs}$ at the output of the second stage of the sampling circuit, for different junction temperatures Tj of 25° C. and 125° C. respectively.
Figure 12B:
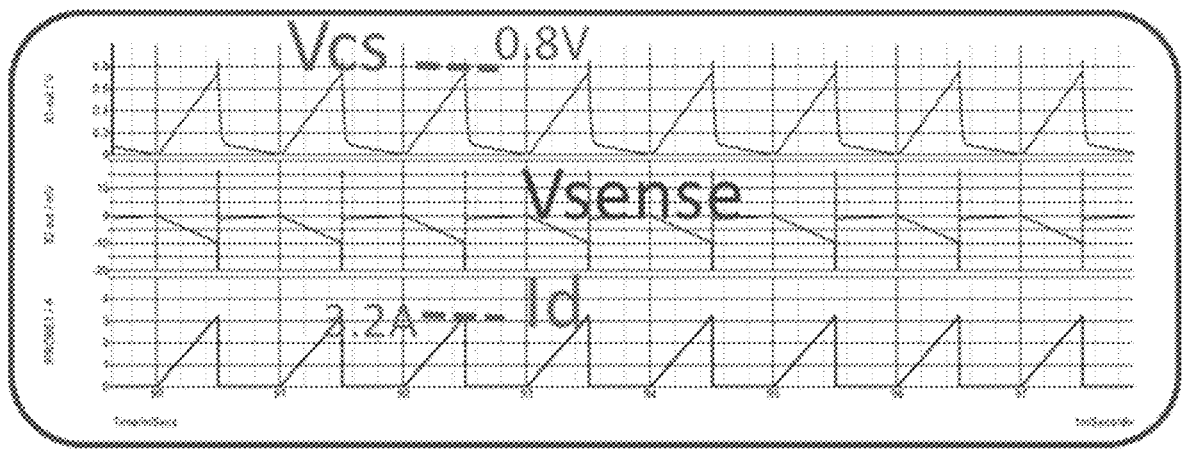

FIGS. 12A and 12B show example waveforms for the current sense circuit of FIG. 11. FIG. 12A shows the waveforms for the drain source current $I_d$, and the sense voltage $V_{sense}$ at the output of the first stage of the sampling circuit, and the current sense $V_{cs}$ at the output of the second stage of the sampling circuit, for a junction temperature Tj of 25° C. FIG. 12B shows corresponding waveforms for a junction temperature of 125° C. At turn-on, the first stage of the sampling circuit receives $I_{cs}$ at the inverting terminal of the OpAmp and generates a small negative output signal $V_{sense}$ which is $-I_{cs}*R_{cs}$. $V_{sense}$ is fed to the inverting terminal of the second stage OpAmp and to provide $V_{cs}=V_{sense}*R2/R1$, which is fed to the current sense terminal of the controller and driver, for current monitoring, or for implementing OCP or SCP if $V_{cs}$ reaches a threshold value to trigger protection. In this example, parameters are selected so that, as illustrated by the waveforms in FIGS. 12A and 12B, when the drain current $I_d$ reaches the OCP limit of 3.2 A (i.e. $I_{cs}=32$ mA), $V_{cs}$ reaches a threshold of 0.8V which triggers the controller and gate driver to implement OCP. Notably, almost the same overcurrent protection is achieved with different junction temperatures Tj of 25° C. and 125° C.

These circuit implementations for high accuracy current sensing, comprising a GaN sense transistor and a GaN power transistor and a sampling circuit, address current sense accuracy problems of conventional senseFET circuits, which result from some parameter deviations of junction temperature (Tj) and gate-to-source voltage ($V_{gs}$). A high accuracy current sense with GaN transistors can be achieved for current feedback functions such as, current loop control, over current protection (OCP) and short circuit protection (SCP).

Figure 13A:
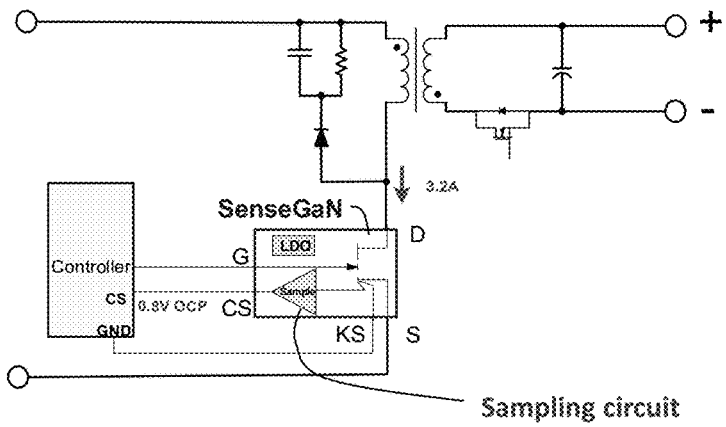
FIG. 13A shows an example 65 W QR Flyback converter and high accuracy SenseGaN current sensing circuit of a third embodiment.
Figure 13B:
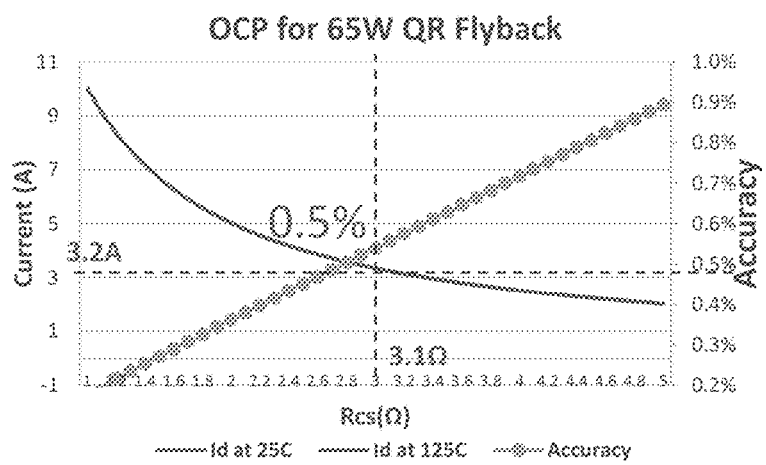
FIG. 13B shows plots of the drain current $I_d$ at junction temperatures Tj of 25° C. and 125° C. and accuracy as a function of the value of the current sense resistor Rcs for a high accuracy SenseGaN circuit of the third embodiment.

To illustrate benefits of a High Accuracy SenseGaN current sense circuit over a conventional SenseGaN current sense circuit for an example 65 W flyback converter, FIG. 13A shows an example 65 W QR Flyback converter wherein the GaN transistor switch comprises a high accuracy Sense-GaN current sensing circuit. FIG. 13B shows plots of the drain current $I_d$ at 25° C. and 125° C., and accuracy as a function of the value of the current sense resistor Rcs for the high accuracy SenseGaN current sensing circuit. The plots for the drain current vs. value of the sense resistor $R_{cs}$ at 25° C. and 125° C. are almost identical (the blue and red plot lines overlap), i.e. are substantially temperature independent. A current sense accuracy of better than 1% is achieved for sense resistor values over the range from 1Ω to 5Ω, and is independent of junction temperature over a range of 25° C. and 125° C. For example, based on the design example shown in FIG. 11, to provide a current sense output voltage Vcs of 0.8V to the controller, to implement OCP at 3.2 A, a small 3Ω current sense resistor is needed. An accuracy of 0.5% is achieved for junction temperatures of 25° C. and 125° C.

It has also been demonstrated that the high accuracy SenseGaN current sensing circuit is scalable for switching devices over a range of powers, e.g. for current protection in a range of a few amps to hundreds of amps.

Figure 14:
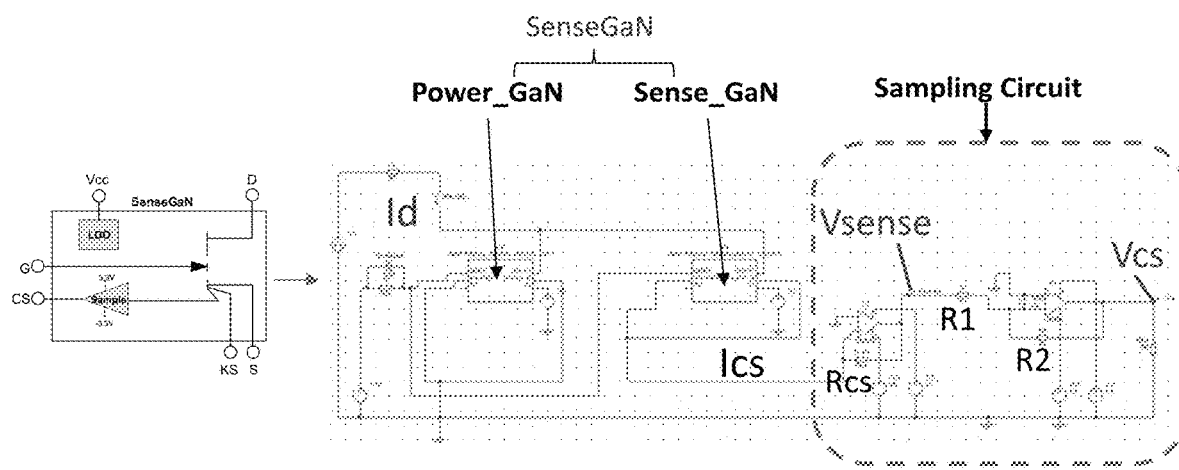
FIG. 14 shows a high current circuit design schematic for a high accuracy current sensing circuit comprising a GaN power transistor, a GaN sense transistor, and a sampling circuit of a fourth embodiment, configured for high power operation with implementation of OCP when $I_d$ reaches 200 A.

For example, FIG. 14 shows an example circuit design schematic for a high accuracy current sensing circuit of another embodiment, comprising a GaN power transistor, a GaN sense transistor, and a sampling circuit for high power operation, for overcurrent protection when $I_d$ reaches 200 Amp. The GaN sense transistor is a GaN Systems GS065-004-1-L transistor having an on-resistance $R_{dson\_cs}$ of 0.45Ω and the GaN power transistor is a GaN Systems GS065-150-1-D, having an on-resistance $R_{dson}$ of 0.01Ω. FIG. 14 includes a table listing parameters for an example scenario, to demonstrate overcurrent protection at junction temperatures of 25° C. and 100° C., i.e. to represent examples for room temperature operation and high temperature operation. Both the GaN power transistor and GaN sense transistor have a 2.2 times temperature coefficient for the temperature range from 25° C. to 100° C. In this example embodiment, which is configured to provide OCP when the drain current $I_d$ reaches is 200 A, i.e. when $I_{cs}$=200/45=4.5 Amp, a first stage of the sampling circuit comprises a first operational amplifier with feedback resistor $R_{cs}$ of 11.5 mΩ to provide a sense voltage $V_{sense}$ of −50 mV. The 50 mV $V_{sense}$ is fed to a second stage comprising an operational amplifier configured as a voltage amplifier with resistors R1=1 kΩ, and R2=16 kΩ, for an amplification ratio of 16, to generate a current sense voltage output $V_{CS}$ of 0.8V which is fed to the controller to trigger OCP.

Figure 15A:
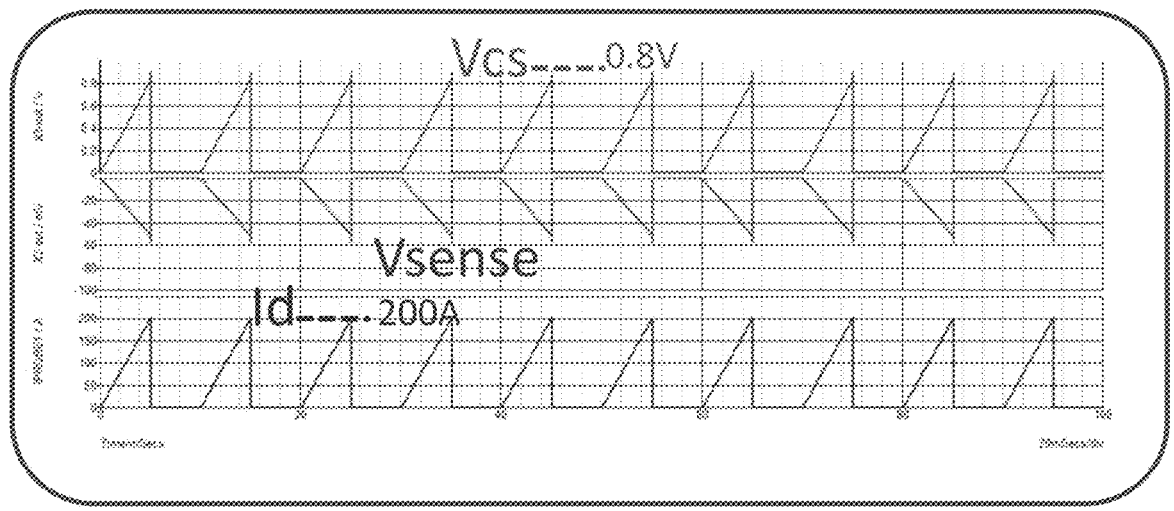
FIGS. 15A and 15B show waveforms for the drain-source current $I_d$, sense voltage $V_{sense}$, and current sense voltage $V_{cs}$ at the output of the sampling circuit, for junction temperatures Tj of 25° C. and 100° C., for the high accuracy SenseGaN circuit of FIG. 14.
Figure 15B:
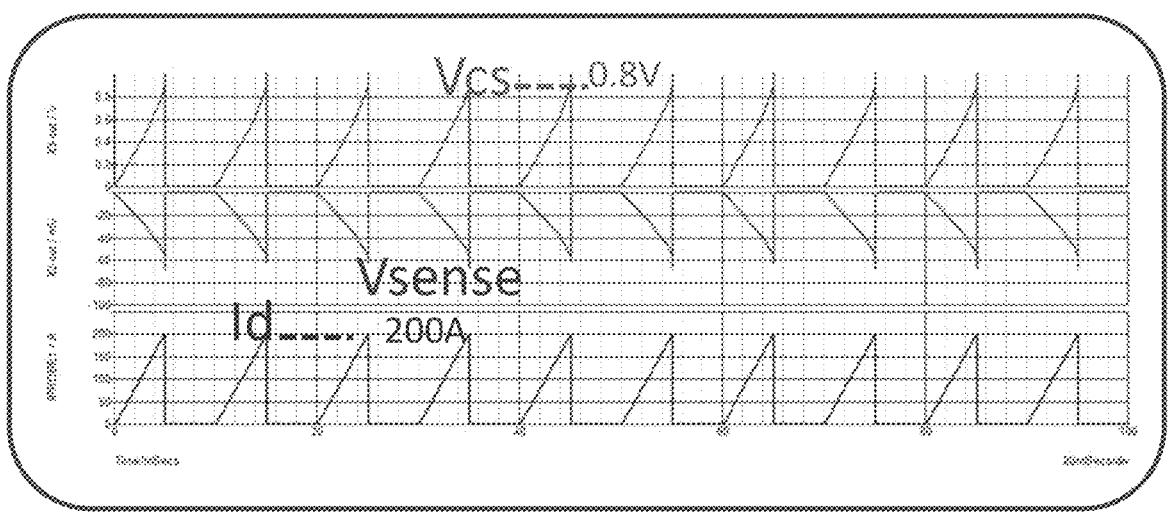

FIGS. 15A and 15B shows waveforms for the drain source current $I_d$, and the sense voltage $V_{sense}$, and the amplified current sense voltage $V_{cs}$ at the output of the second stage of the sampling circuit, for junction temperatures Tj of 25° C. and 100° C. respectively. Almost the same overcurrent protection is achieved with different junction temperatures.

Current sensing circuits of example embodiments have been described which provide lossless, high accuracy and fast current sensing. Use of a sampling circuit comprising first and second stage operational amplifiers increases current accuracy.

The high accuracy current sensing circuit may be implemented with an integrated SenseGaN transistor or with discrete components, i.e. a discrete power GaN transistor and discrete sense GaN transistor, and a separate sampling circuit. The sampling circuit may be integrated with the SenseGaN transistor. The sampling circuit may be integrated with the controller/driver.

The current accuracy is improved, for different junction temperatures and different gate-to-source voltage $V_{gs}$. In one example embodiment comprising a QR flyback AC/DC converter, simulation and calculation demonstrates an accuracy of 1% at junction temperatures of 25° C. and 125° C.

Applications of the high accuracy current sense circuit include switch mode power supplies which benefit from high speed and lossless current sensing. This circuit topology is scalable for low power (e.g. <100 W), such as AC/DC adapters for smartphones, tablets and PCs, and medium and high power applications, e.g. 500 W to kW range, for example, telecom datacentre power supplies, on-board chargers for electric vehicles, et al.

Reliability and efficiency are improved relative to using a high current shunt resistor (e.g. see FIG. 10 or a conventional SenseFET and sense resistor circuit (e.g. see FIG. 3). For the is example design of a charger comprising a 65 W QR flyback converter, efficiency is improved by greater than 0.5%. Alternatively, if a lower cost SenseGaN transistor, e.g. higher $R_{dson}$, is used to decrease BOM costs, since losses from a high current shunt resistor are eliminated, the same efficiency can be maintained.

High current accuracy is achieved with fast response, for any one of current monitoring and feedback control, overcurrent protection and short circuit protection. Applications include current sensing for switching mode power supplies that need high speed and lossless current sense for current protection and feedback. By using a high accuracy Sense-GaN current sensing circuit comprising a sampling circuit, similar efficiency gains can be realized for QR and ACF switching topologies. More generally, the high accuracy current sensing circuit can be applied to other switch mode power electronics topologies, such as AC/DC and DC/DC converters.

Current sensing circuits of example embodiments have been described with reference to power switching devices comprising GaN transistors, which for example, may be lateral GaN HEMTs. In other embodiments, it is envisaged that current sensing circuits providing high accuracy current sensing may be applicable to power switching devices comprising power transistors based other semiconductor technologies, e.g. Si MOSFETs and SiC MOSFETs.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A current sensing circuit for a power switching device comprising: a GaN power transistor and a GaN sense transistor, each having a drain, a source and a gate; and a sampling circuit;

the sampling circuit having first and second inputs and an output;

the GaN sense transistor being configured as a current mirror with the drain of the GaN power transistor being connected to the drain of the GaN sense transistor, the gate of the GaN power transistor being connected to the gate of the GaN sense transistor, the source of the GaN sense transistor being connected to the first input of the sampling circuit to provide a current sense input $I_{cs}$ to the sampling circuit, and the source of the GaN sense transistor and the second input of the sampling circuit being connected to a Kelvin source of the GaN power transistor, whereby the gate-to-source voltage of the GaN sense transistor and the gate-to-source voltage of the GaN power transistor are substantially the same;

the sampling circuit being configured to convert the current sense input $I_{cs}$ to a first sense voltage $V_{sense}$ and to amplify the first sense voltage $V_{sense}$ to provide a second sense voltage $V_{cs}$ at the output of the sampling circuit.

2. The current sensing circuit of claim 1, wherein the sampling circuit comprises a first stage and a second stage, the first stage being a current to voltage converter which receives the current $I_{cs}$ from the GaN sense transistor and outputs the first sense voltage $V_{sense}$; and the second stage being a voltage amplifier which receives the sense voltage $V_{sense}$ and outputs the second sense voltage $V_{cs} = n*V_{sense}$.

3. The current sensing circuit of claim 1, wherein the sampling circuit comprises first and second stage operational amplifiers, the first stage operational amplifier being configured as a current to voltage converter with a feedback resistor $R_{cs}$, wherein its inverting input receives the current $I_{cs}$ from the GaN sense transistor and its non-inverting input is connected to the Kelvin source, to provide the first sense voltage $V_{sense}$ at a first stage output;

the second stage operational amplifier being configured as a voltage amplifier with an amplification ratio n which receives the sense voltage $V_{sense}$ at its inverting input, and its non-inverting input is connected to the Kelvin source, to provide the second sense voltage $V_{cs} = n*V_{sense}$ at a second stage output.

4. The current sensing circuit of claim 3, wherein, for a required maximum drain current $I_{dmax}$ for triggering current protection functions, and a specified on-resistance ratio $R_{dson\_cs}/R_{dson}$ for the GaN power transistor and the GaN sense transistor, the value of $R_{cs}$ is selected to provide the first sense voltage $V_{sense}$ in a range up to 100 mV, and $V_{sense}$ is amplified to provide the second sense voltage $V_{cs}$ that is a specified trigger voltage for a controller/driver for overcurrent protection or short circuit protection.

5. The current sensing circuit of claim 4, wherein the value of $R_{cs}$ is selected to be small enough to provide a current accuracy of better than 1% while optimizing $V_{sense}$ and $V_{cs}$ to provide the specified trigger voltage.

6. The current sensing circuit of claim 3, wherein, for a required maximum drain current $I_{dmax}$ for triggering current protection functions, $R_{cs}$ is selected to provide the first sense voltage $V_{sense}$ in a range from tens of mV to around 100 mV, and $V_{sense}$ is amplified to provide the second sense voltage $V_{cs}$ of ~1V.

7. The current sensing circuit of claim 3, wherein the amplification ratio of the second stage is in a range from ~10 to ~100.

8. The current sensing circuit of claim 3, wherein
for a required maximum drain current $Id_{max}$ for triggering current protection functions, $R_{cs}$ is selected to provide the first sense voltage $V_{sense}$ in a range from tens of mV to around 100 mV, and the second stage operational amplifier comprises first and second resistors R1 and R2 to provide an amplification ratio of R2/R1, and wherein R1 and R2 are trimmed to match $V_{cs}$ to a specified trigger voltage for a controller/driver for overcurrent protection or short circuit protection.

9. The current sensing circuit of claim 1, wherein the sense GaN transistor and the power GaN transistor are monolithically integrated.

10. The current sensing circuit of claim 9, wherein the sampling circuit is monolithically integrated with the sense GaN transistor and the power GaN transistor.

11. The current sensing circuit of claim 1, wherein the sense GaN transistor is discrete from the power GaN transistor.

12. The current sensing circuit of claim 11, wherein the sense GaN transistor is discrete from the power GaN transistor and the sense GaN transistor is monolithically integrated with the sampling circuit.

13. The current sensing circuit of claim 1, wherein the output of the sampling circuit is connected to the current sense input of a controller/gate driver for driving the gates of the sense GaN transistor and the power GaN transistor, to feed the second sense voltage $V_{cs}$ to the controller for implementing any one of current monitoring and feedback, overcurrent protection and short circuit protection.

14. The current sensing circuit of claim 1 providing a current accuracy of better than 1%, which is substantially independent of junction temperature over a range of 25° C. to 125° C.

15. A flyback converter comprising the current sensing circuit of claim 1.

16. A switch mode power supply comprising the current sensing circuit claim 1.

* * * * *